United States Patent [19]
Herd

[11] Patent Number: 5,485,730
[45] Date of Patent: Jan. 23, 1996

[54] REMOTE COOLING SYSTEM FOR A SUPERCONDUCTING MAGNET

[75] Inventor: Kenneth G. Herd, Niskayuna, N.Y.

[73] Assignee: General Electric Company, Schenectady, N.Y.

[21] Appl. No.: 288,178

[22] Filed: Aug. 10, 1994

[51] Int. Cl.[6] .................................................. F25B 19/00
[52] U.S. Cl. .......................................... 62/51.1; 62/259.2
[58] Field of Search ................................... 62/51.1, 259.2

[56] References Cited

U.S. PATENT DOCUMENTS

| | | | |
|---|---|---|---|
| 4,223,540 | 9/1980 | Longsworth | 62/51.1 |
| 4,277,949 | 7/1981 | Longsworth | 62/51.1 |
| 4,432,216 | 2/1984 | Matsuda et al. | 62/51.1 |
| 4,986,078 | 1/1991 | Laskaris | 62/51.1 |
| 5,111,665 | 5/1992 | Ackermann | 62/51.1 |
| 5,193,348 | 3/1993 | Schnapper | 62/51.1 |
| 5,216,889 | 6/1993 | Herd et al. | 62/51.1 |

FOREIGN PATENT DOCUMENTS

| | | |
|---|---|---|
| 2423301 | 2/1975 | Germany. |
| 2233750 | 1/1991 | United Kingdom. |

OTHER PUBLICATIONS

U.S. patent application Ser. No. 08/000,303, filed on Jan. 4, 1993, by E. T. Laskaris et al. "Cold Head Sleeve and High-Tc Superconducting Lead Assemblies for a Superconducting Magnet Which Images Human Limbs".
U.S. patent application Ser. No. 08/201,964, filed Feb. 24, 19934 by K. G. Herd et al. "Quench-Protected, Refrigerated Superconducting Magnet".
U.S. patent application Ser. No. 08/201,968, filed Feb. 25, 1994, by E. T. Herd et al. "Superconducting Magnet Having a Retractable Cryocooler Sleeve Assembly".
U.S. patent application Ser. No. 08/267,625, filed Jun. 29, 1994, by E. T. Laskaris et al., "Superconducting Rotor for an Electrical Machine".
U.S. patent application Docket No. RD-23729, filed on or about Aug. 3, 1994, by E. T. Laskaris et al., "Hybrid Cooling System for a Superconducting Magnet". (Serial No. not yet received).

*Primary Examiner*—Ronald C. Capossela
*Attorney, Agent, or Firm*—Douglas E. Erickson; Paul R. Webb, II

[57] ABSTRACT

A cooling system for a superconductive magnet. A cryocooler coldhead and a compressor are remotely located from the magnet. A helium-gas conduit circuit has five helium-gas paths. The first path extends from the compressor's outlet port to being in proximate thermal contact with the coldhead's first stage. The second path extends from there to being in proximate thermal contact with the coldhead's second stage. The third path extends from there to being in proximate thermal contact with the magnet's superconductive coil. The fourth path extends from there to being in proximate thermal contact with the magnet's thermal shield. The fifth helium-gas path extends from there to the compressor's inlet port. By remotely siting the cryocooler coldhead away from the magnet and using helium gas for cooling, the vibrating coldhead will not affect the magnet and the helium-gas conduit circuit can have additional branches to cool additional magnets and can have rotatable couplings for cooling rotating superconductive rotors.

6 Claims, 2 Drawing Sheets

REMOTE COOLING SYSTEM FOR A SUPERCONDUCTING MAGNET

BACKGROUND OF THE INVENTION

The present invention relates generally to a superconducting magnet and more particularly to a cooling system for such a magnet.

Superconducting magnets are used, or are planned to be used, in various apparatus such as, but not limited to, magnetic resonance imaging (MRI) systems for medical diagnosis, superconductive rotors for electric generators and motors, and magnetic levitation devices for train transportation. The superconducting coil assembly of a superconducting magnet includes a vacuum enclosure containing one or more superconductive coils which are wound from superconductive wire.

Some superconductive magnets are conductively cooled by a cryocooler coldhead (such as that of a conventional Gifford-McMahon cryocooler) which is mounted to the magnet. Such mounting of the cryocooler coldhead to the magnet creates difficulties including the detrimental effects of stray magnetic fields on the coldhead motor, vibration transmission from the coldhead to the magnet, and temperature gradients along the thermal connections between the coldhead and the magnet. Such conduction cooling is not generally suitable for cooling rotating magnets such as a superconductive rotor.

Other superconductive magnets are cooled by liquid helium in direct contact with the magnet, with such liquid helium boiling off as gaseous helium during magnet cooling and with such gaseous helium typically escaping from the magnet to the atmosphere. Locating the liquid helium containment inside the vacuum enclosure of the magnet increases the size of the magnet system which is undesirable in many superconductive magnet applications.

What is needed is an improved cooling system for a superconductive magnet. Further, the cooling system must be remotely located from the magnet. Additionally, the cooling system should be capable of cooling multiple superconductive coil assemblies and should be capable of cooling rotating magnets.

SUMMARY OF THE INVENTION

It is an object of the invention to provide a cooling system for a superconductive magnet wherein the cooling system is remotely located from the magnet.

In a first embodiment, the cooling system of the invention is for a superconductive magnet having a superconductive coil. The cooling system includes a cryocooler coldhead having a stage, a compressor having an outlet port and an inlet port, and a helium-gas conduit circuit. The cryocooler coldhead and the compressor each are located outside and spaced apart from the magnet. The helium-gas conduit circuit has a delivery helium-gas path, a supply helium-gas path, and a return helium-gas path. The delivery helium-gas path extends from the outlet port of the compressor to a coldhead-vicinity location which is in proximate thermal contact with the stage of the cryocooler coldhead. The supply helium-gas path extends from the delivery helium-gas path at the coldhead-vicinity location to a magnet-vicinity location which is in proximate thermal contact with the superconductive coil of the magnet. The return helium-gas path extends from the supply helium-gas path at the magnet-vicinity location to the inlet port of the compressor. The helium-gas paths are distinct from each other.

In a second embodiment, the cooling system of the invention is for a superconductive magnet having a thermal shield and having a superconductive coil located generally within and spaced apart from the thermal shield. The cooling system includes a cryocooler coldhead having a first stage and a colder second stage, a compressor having an outlet port and an inlet port, and a helium-gas conduit circuit. The cryocooler coldhead and the compressor each are located outside and spaced apart from the magnet. The helium-gas conduit circuit has first through fifth helium-gas paths. The first helium-gas path extends from the outlet port of the compressor to a first location which is in proximate thermal contact with the first stage of the cryocooler coldhead. The second helium-gas path extends from the first helium-gas path at the first location to a second location which is in proximate thermal contact with the second stage of the cryocooler coldhead. The third helium-gas path extends from the second helium-gas path at the second location to a third location which is in proximate thermal contact with the superconductive coil of the magnet. The fourth helium-gas path extends from the third helium-gas path at the third location to a fourth location which is in proximate thermal contact with the thermal shield of the magnet. The fifth helium-gas path extends from the fourth helium-gas path at the fourth location to the inlet port of the compressor. The helium-gas paths are distinct from each other.

Several benefits and advantages are derived from the invention. Locating the cryocooler coldhead and the compressor outside and spaced apart from the magnet allows for remote siting of the cooling system away from the magnet eliminating undesirable vibration and other problems created when a cryocooler coldhead is conventionally mounted to the magnet. Using the helium-gas circuit as part of the cooling system allows for cooling of multiple magnets by adding branch paths to the helium-gas circuit to cool the additional magnets. Furthermore, the helium-gas circuit may contain a rotatable coupling (i.e., a gaseous-helium transfer coupling including stationary and rotating components) to connect with and cool the superconductive magnet of a rotating superconductive rotor.

BRIEF DESCRIPTION OF THE DRAWINGS

The accompanying drawings illustrate two preferred embodiments of the present invention wherein.

DETAILED DESCRIPTION OF THE INVENTION

Figure 1:
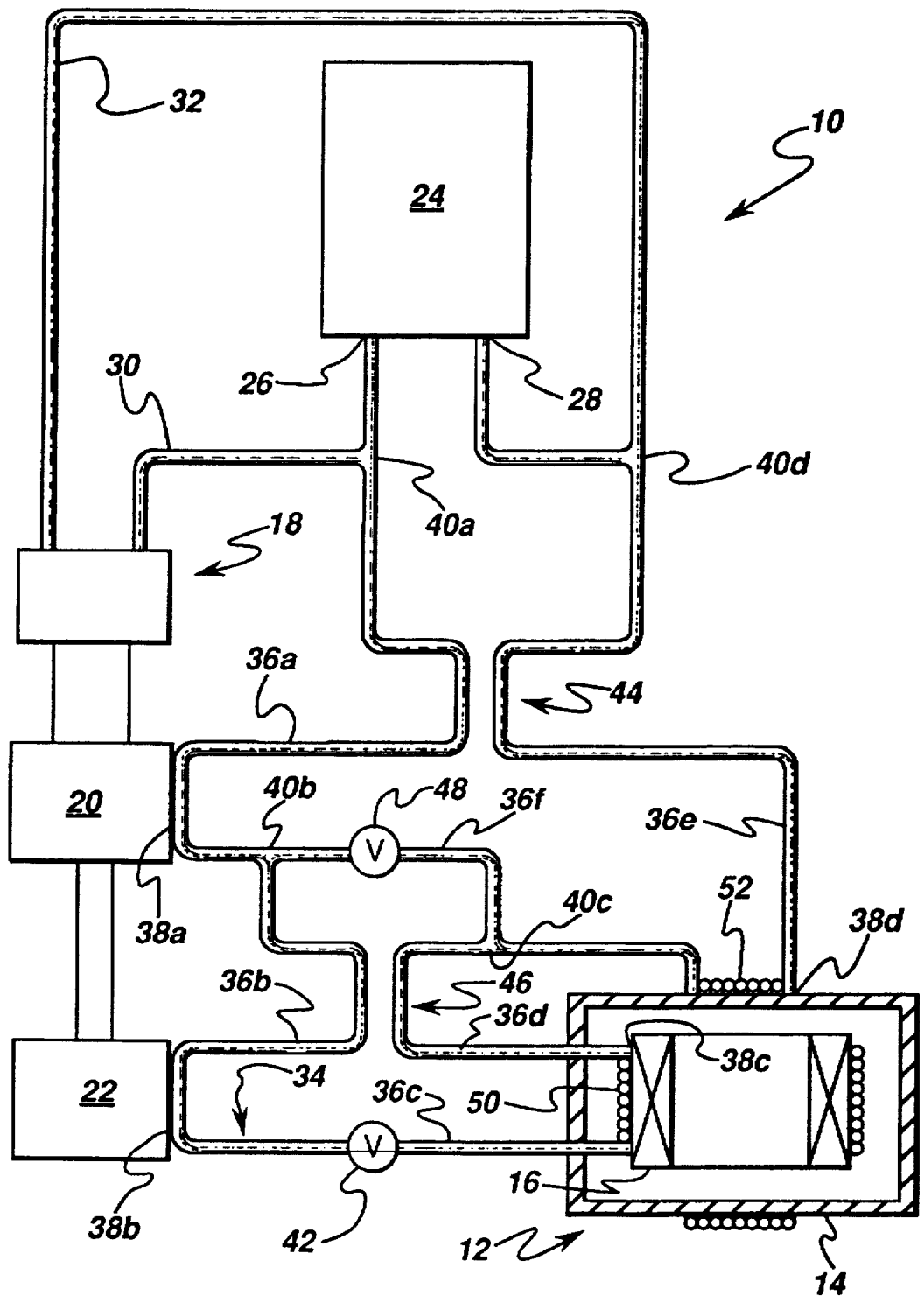
FIG. 1 is a schematic cross-sectional view of a first preferred embodiment of the cooling system of the invention including a two-stage cryocooler coldhead and also showing a superconductive magnet which includes a thermal shield and a superconductive coil.

Referring now to the drawings, FIG. 1 schematically shows the cooling system 10 of a first preferred embodiment of the present invention. The cooling system 10 is for a superconductive magnet. 12 having a thermal shield 14 and having a superconductive coil 16 disposed generally within and spaced apart from the thermal shield 14. The magnet 12 also has a vacuum enclosure (omitted from FIG. 1 for clarity) which surrounds and is spaced apart from the thermal shield. Conventional spacers (omitted from FIG. 1 for clarity), such as thermally insulating tubes, space and support the superconductive coil 16 from the thermal shield 14 and the thermal shield 14 from the vacuum enclosure.

The cooling system 10 includes a stationary cryocooler coldhead 18 (such as that of a conventional two-stage Gifford McMahon cryocooler) disposed outside and spaced apart from the magnet 12. The cryocooler coldhead 18 has a first stage 20 and a second stage 22 wherein the second stage 22 is colder than the first stage 20. A two (or more) stage cryocooler coldhead 18 typically is required to reach the low critical temperatures of typical superconductive materials comprising the superconductive wire of the superconductive coil 16. For example, for a Nb—Sn superconductive wire having a critical temperature (which depends on current and field) of generally 12 Kelvin for superconductivity, the first; stage 20 of the cryocooler coldhead 18 may have a temperature of generally 40 Kelvin and the second stage 22 of the cryocooler coldhead 18 may have a temperature of generally 10 Kelvin.

The cooling system 10 also includes a stationary compressor 24 disposed outside and spaced apart from the magnet 12. The compressor 24 has an outlet port 26 and an inlet port 28. The compressor 24 may be the same compressor as that used for the cryocooler coldhead 18 or it may be a separate compressor. If the compressor 24 is the same compressor as that used for the cryocooler coldhead 18, the cooling system 10 would also include a helium-gas supply line 30 and a helium-gas return line 32 each in fluid communication with the cryocooler coldhead 18 and with the compressor 24.

The cooling system 10 further includes a thermally-insulated helium-gas conduit circuit 34 having a first through a fifth helium-gas path 36a to 36e. The first helium-gas path 36a extends from the outlet port 26 of the compressor 24 to a first location 38a which is in proximate thermal contact with the first stage 20 of the cryocooler coldhead 18. It is noted that such path 36a passes by a first intermediate location 40a seen in FIG. 1. By "proximate thermal contact" is meant that the particular location to which the helium-gas path extends is a location such that the helium gas inside the helium-gas conduit circuit 34 along that helium-gas path at that location is located proximate and in thermal contact with the specified component. Thus, the helium gas inside the helium-gas conduit circuit 34 along the first helium-gas path 36a at the first location 38a is located proximate and in thermal contact with the first stage 20 of the cryocooler coldhead 18. A best mode of accomplishing this is to have the helium-gas conduit circuit 34 at the first location 38a be in direct physical contact with the first stage 20 of the cryocooler coldhead 18. Such direct physical contact is shown schematically in Figure 1 with a preferred contact being one in which the helium-gas conduit circuit is coiled around, and in direct physical contact with, the first stage of the cryocooler coldhead (such preferred heat exchanger design not shown in FIG. 1).

The second helium-gas path 36b extends from the first helium-gas path 36a at the first location 38a to a second location 38b which is in proximate thermal contact with the second stage 22 of the cryocooler coldhead 18. It is noted that such path 36b passes by a second intermediate location 40b seen in FIG. 1. The third helium-gas path 36c extends from the second helium-gas path 36b at the second location 38b to a third location 38c which is in proximate thermal contact with the superconductive coil 16 of the magnet 12.

The fourth helium-gas path 36d extends from the third helium-gas path 36c at the third location 38c to a fourth location 38d which is in proximate thermal contact with the thermal shield 14 of the magnet 12. It is noted that such path 36d passes by a third intermediate location 40c seen in FIG. 1. The fifth helium-gas path 36e extends from the fourth helium-gas path 36d at the fourth location 38d to the inlet port 28 of the compressor 24. It is noted that such path 36e passes by a fourth intermediate location 40d seen in FIG. 1. The helium-gas paths 36a to 36e are distinct from each other. Thus, no part of one helium-gas path is a part of another helium-gas path.

Preferably, the cooling system 10 additionally includes an expansion valve 42 disposed in the third helium-gas path 36c. It is noted that a turbo-expander (i.e., an expansion turbine) is equivalent to an expansion valve. In an exemplary embodiment, a portion of the first helium-gas path 36a and a portion of the fifth helium-gas path 36e are in proximate thermal contact so as to define a first counterflow heat exchanger 44, and a portion of the second helium-gas path 36b and a portion of the fourth helium-gas path 36d are in proximate thermal contact so as to define a second counterflow heat exchanger 46.

In a preferred embodiment, the helium-gas conduit circuit 34 also includes a sixth helium-gas path 36f connecting the second helium-gas path 36b to the fourth helium-gas path 36d. The sixth helium-gas path 36f is distinct from the other helium-gas paths 36a to 36e. It is noted that the sixth helium-gas path 36f connects the second helium-gas path 36b proximate the second intermediate location 40b to the fourth helium-gas path 36d proximate the third intermediate location 40c as seen in FIG. 1. The sixth helium-gas path 36f is used because the total helium-gas flow from location 38a is more than what is needed for the second stage 22 of the cryocooler coldhead 18 and because more heat is taken from the thermal shield 14 of the magnet 12 than is taken from the superconductive coil 16 of the magnet 12. Preferably, the cooling system 10 moreover includes an expansion valve 48 disposed in the sixth helium-gas path 36f. In an exemplary embodiment, the third helium-gas path 36c includes a portion 50 which has a first plurality of turns in surrounding thermal contact with the superconductive coil 16 of the magnet 12, and the fourth helium-gas path 36d includes a portion 52 which has a second plurality of turns in surrounding thermal contact with the thermal shield 14 of the magnet 12.

The operation of the cooling system 10 of the invention is best explained in terms of an example based on a sub-scale model of the cooling system 10 of the invention designed and built by Applicant in which a heat load inside the cryocooler coldhead 18 was used in place of the superconductive magnet 12. The following data is based on design calculations and not on test results. A 95% heat exchanger efficiency was assumed. The static pressure of the helium gas in the helium-gas conduit circuit 34 along the first helium-gas path 36a at the outlet port 26 of the compressor 24 was generally 300 psig and along the fifth helium-gas path 36e at the inlet port 28 of the compressor 24 was generally 100 psig where "psig" stands for "pounds per square inch above gauge" (meaning above atmospheric pressure). Generally 2.5 grams per second of gaseous helium flowed through the helium-gas supply line 30, generally 0.3 grams per second of gaseous helium flowed through the first helium-gas path 36a downstream from the first intermediate location 40a, generally 0.1 grams per second of gaseous helium flowed through the second helium-gas path 36b downstream from the second intermediate point 40b, and generally 0.2 grams per second of gaseous helium flowed through the sixth helium-gas path 36f. It is noted that the pressure drops in the system determine the mass flow rates of the helium gas in the various gas paths 36a to 36f and gas lines 30 and 32. A metering valve (not shown in FIG. 1) was installed in the fifth helium-gas path 36e between the first counterflow heat exchanger 44 and the fourth intermediate location 40d to help control the desired gaseous helium mass flow rates. It is noted that the helium-gas supply line 30 was connected to the helium-gas conduit circuit 34 at the first intermediate location 40a and the helium-gas return line 32 was connected to the helium-gas conduit circuit 34 at the fourth intermediate location 40d. The first stage 20 of the cryocooler coldhead 18 was maintained at a temperature of generally 40 Kelvin and had a cooling capacity of generally 35 watts, and the second stage 22 of the cryocooler coldhead 18 was maintained at a temperature of generally 10 Kelvin and had a cooling capacity of generally 1.5 watts. The expansion valve 42 in the third helium-gas path 36c reduced the pressure from generally 300 psig to generally 100 psig which reduced the temperature of the gaseous helium to generally 8.5 Kelvin. The heat load simulating the superconductive coil 16 of the magnet 12 was generally 0.5 watts and raised the temperature of the gaseous helium in the portion 50 of the third helium-gas path 36c from generally 8.5 to generally 9.5 Kelvin. The expansion valve 48 in the sixth helium-gas path 36f reduced the pressure from generally 300 psig to generally 100 psig. The heat load simulating the thermal shield 14 of the magnet 12 was generally 15 watts and raised the temperature of the gaseous helium in the portion 52 of the third helium-gas path 36c from generally 40 to generally 50 Kelvin. The first counterflow heat exchanger 44 had a temperature of generally 300 Kelvin at its "hot" side and a temperature of generally 50 Kelvin at its "cold" side. The second counterflow heat exchanger 46 had a temperature of generally 40 Kelvin at its "hot" side and a temperature of generally 9.5 Kelvin at its "cold" side.

As can be appreciated by those skilled in the art, in the event of cryocooler malfunction, the helium gas flow can be stopped which will essentially thermally isolate the magnet 12. The pressurized helium gas in the helium-gas conduit circuit 34 acts as a thermal buffer which allows time to replace the cryocooler before the magnet 12 quenches (i.e., loses its superconductivity).

Figure 2:
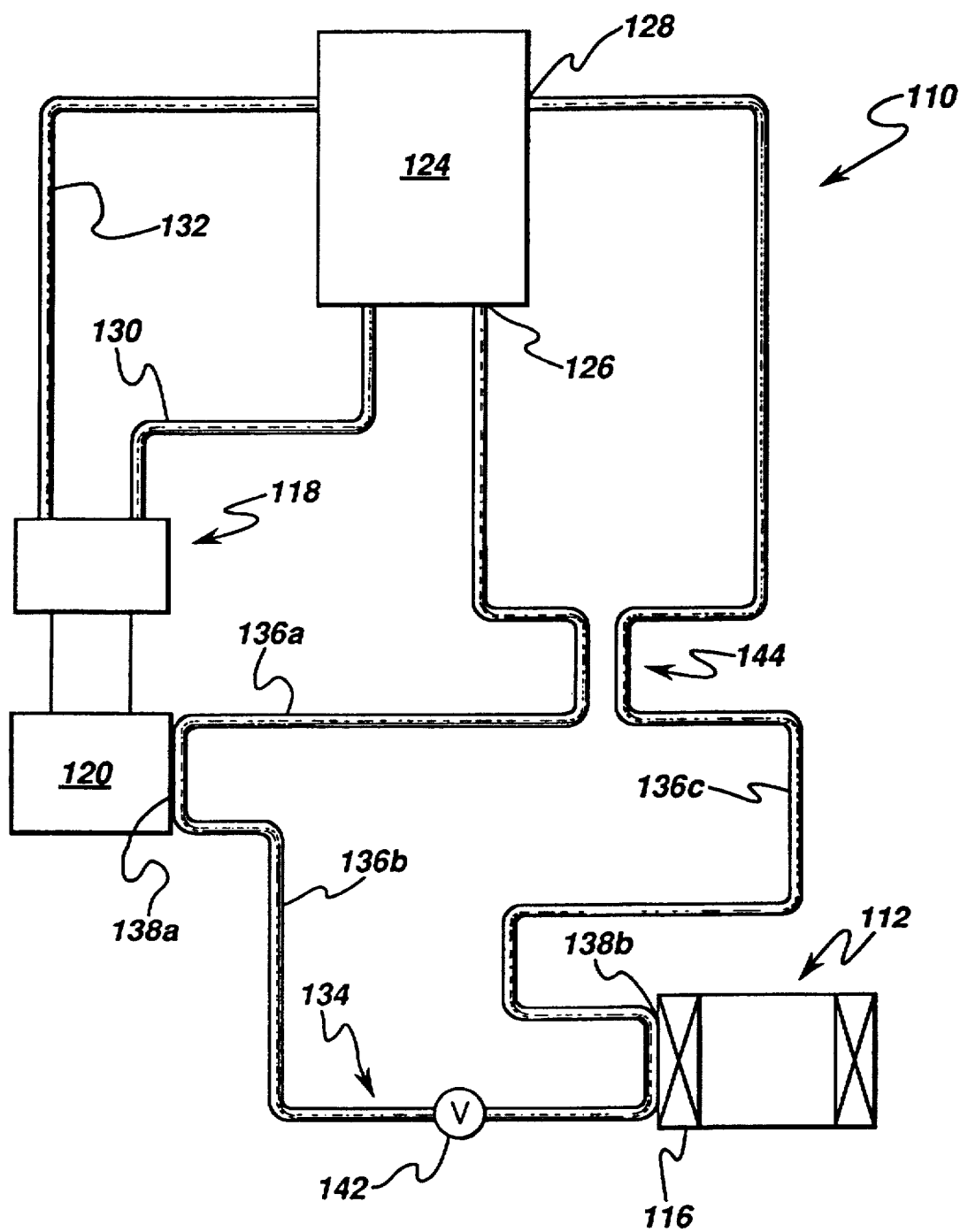
FIG. 2 is a schematic cross-sectional view of a second preferred embodiment of the cooling system of the invention including a single-stage cryocooler coldhead and also showing a superconductive magnet which includes a superconductive coil.

Referring again to the drawings, FIG. 2 schematically shows the cooling system 110 of a second preferred embodiment of the present invention. The cooling system 110 is for a superconductive magnet 112 having a superconductive coil 16. The magnet 112 also has a vacuum enclosure (omitted from FIG. 2 for clarity).

The cooling system 110 includes a cryocooler coldhead 118 (such that of a conventional single-stage Gifford McMahon cryocooler) disposed outside and spaced apart from the magnet 112. The cryocooler coldhead 118 has a stage 120. A single-stage cryocooler coldhead 118 typically would be all that is required to reach the relatively high critical temperatures of hoped-for future superconductive materials that would someday comprise the superconductive wire of the superconductive coil 116. For example, for a future superconductive wire having a critical temperature of generally 42 Kelvin or higher for superconductivity, the stage 120 of the single-stage cryocooler coldhead 118 would be maintained at a temperature of generally 40 Kelvin. It is noted that, a thermal shield would no longer be required for such a magnet.

The cooling system 110 also includes a compressor 124 disposed outside and spaced apart from the magnet 112. The compressor 124 has an outlet port 126 and an inlet port 128. The compressor 124 may be the same compressor as that used for the cryocooler coldhead 118 or it may be a separate compressor. If the compressor 124 is the same compressor as that used for the cryocooler coldhead 118, the cooling system 110 would also include a helium-gas supply line 130 and a helium-gas return line 132 each in fluid communication with the cryocooler coldhead 118 and with the compressor 124.

The cooling system 110 further includes a helium-gas conduit circuit 134 having a delivery helium-gas path 136a, a supply helium-gas path 136b, and a return helium-gas path 136c. The delivery helium-gas path 136a extends from the outlet port 126 of the compressor 124 to a coldhead-vicinity location 138a which is in proximate thermal contact with the stage 120 of the cryocooler coldhead 118. The supply helium-gas path 136b extends from the delivery helium-gas path 136a at the coldhead-vicinity location 138a to a magnet-vicinity location 138b which is in proximate thermal contact with the superconductive coil 116 of the magnet 112. The return helium-gas path 136c extends from the supply helium-gas path 136b at the magnet-vicinity location 138b to the inlet port 128 of the compressor 124. The helium-gas paths 136a to 136c are distinct from each other.

Preferably, the cooling system 110 additionally includes an expansion valve 142 disposed in the supply helium-gas path 136b. In an exemplary embodiment, a portion of the delivery helium-gas path 136a and a portion of the return helium-gas path 136c are in proximate thermal contact so as to define a counterflow heat exchanger 144.

The foregoing description of several preferred embodiments of the invention has been presented for purposes of illustration. It is not intended to be exhaustive or to limit the invention to the precise form disclosed, and obviously many modifications and variations are possible in light of the above teaching. It is noted that the terminology "thermal contact" includes direct structural contact as well as indirect structural contact. It is intended that the scope of the invention be defined by the claims appended hereto.

I claim:

1. A cooling system for a superconductive magnet having a thermal shield and having a superconductive coil disposed generally within and spaced apart from said thermal shield, said cooling system comprising:

a) a cryocooler coldhead disposed outside and spaced apart from said magnet and having a first stage and a second stage, wherein said second stage is colder than said first stage;

b) a compressor disposed outside and spaced apart from said magnet and having an outlet port and an inlet port; and c) a helium-gas conduit circuit having:

(1) a first helium-gas path extending from said outlet port of said compressor to a first location which is in proximate thermal contact with said first stage of said cryocooler coldhead;

(2) a second helium-gas path extending from said first helium-gas path at said first location to a second location which is in proximate thermal contact with said second stage of said cryocooler coldhead;

(3) a third helium-gas path extending from said second helium-gas path at said second location to a third location which is in proximate thermal contact with said superconductive coil of said magnet;

(4) a fourth helium-gas path extending from said third helium-gas path at said third location to a fourth location which is in proximate thermal contact with said thermal shield of said magnet;

(5) a fifth helium-gas path extending from said fourth helium-gas path at said fourth location to said inlet port of said compressor, and wherein said helium-gas paths are distinct from each other.

2. The cooling system of claim 1, wherein said helium-gas conduit circuit also includes a sixth helium-gas path connecting said second helium-gas path to said fourth helium-gas path, wherein said sixth helium-gas path is distinct from said other helium-gas paths, and also including an expansion valve disposed in said sixth helium-gas path.

3. The cooling system of claim 1, wherein said third helium-gas path includes a portion which has a first plurality of turns in surrounding thermal contact with said superconductive coil of said magnet, and wherein said fourth helium-gas path includes a portion which has a second plurality of turns in surrounding thermal contact with said thermal shield of said magnet.

4. The cooling system of claim 1, also including an expansion valve disposed in said third helium-gas path.

5. The cooling system of claim 1, wherein a portion of said first helium-gas path and a portion of said fifth helium-gas path are in proximate thermal contact so as to define a first counterflow heat exchanger, and wherein a portion of said second helium-gas path and a portion of said fourth helium-gas path are in proximate thermal contact so as to define a second counterflow heat exchanger.

6. The cooling system of claim 5, also including a first expansion valve disposed in said third helium-gas path, and also including a helium-gas supply line and a helium-gas return line each in fluid communication with said cryocooler coldhead and with said compressor.

* * * * *